United States Patent [19]
Van Asten

[11] Patent Number: 4,916,575
[45] Date of Patent: Apr. 10, 1990

[54] MULTIPLE CIRCUIT BOARD MODULE

[76] Inventor: Francis C. Van Asten, 296 Little John Dr., Circle Pines, Minn. 55014

[21] Appl. No.: 229,430

[22] Filed: Aug. 8, 1988

[51] Int. Cl.[4] .............................................. H05K 7/20
[52] U.S. Cl. .................................... 361/386; 165/80.3; 165/185; 174/16.3; 357/81; 361/388; 361/399
[58] Field of Search .............................. 165/80.3, 185; 174/16.3; 357/81; 361/381, 386–388, 393–395, 399, 417, 419–420

[56] References Cited

U.S. PATENT DOCUMENTS

| | | | |
|---|---|---|---|
| 3,147,402 | 9/1964 | Hochstetler | 361/388 |
| 3,348,148 | 10/1967 | Parsons et al. | 361/389 |
| 4,716,498 | 12/1987 | Ellis | 361/395 |
| 4,771,365 | 9/1988 | Cichocki et al. | 361/412 |

OTHER PUBLICATIONS

Jackson et al, "Heat Transfer Structure For Electronic Subassemblies", IBM Technical Disclosure Bulletin, vol. 13, No. 12, 5/71, pp. 3644–3645.

Primary Examiner—Gregory D. Thompson
Attorney, Agent, or Firm—Albert W. Watkins

[57] ABSTRACT

A circuit board module which houses multiple circuit boards. The module includes a thermally conductive frame having a plurality of ribs which extend between the frame side walls. One or more support plates are secured to the frame and support the circuit boards, which contain a plurality of heat generating electronic components. The heat generated by these components is directed through the support plates to the frame for dissipation.

15 Claims, 6 Drawing Sheets

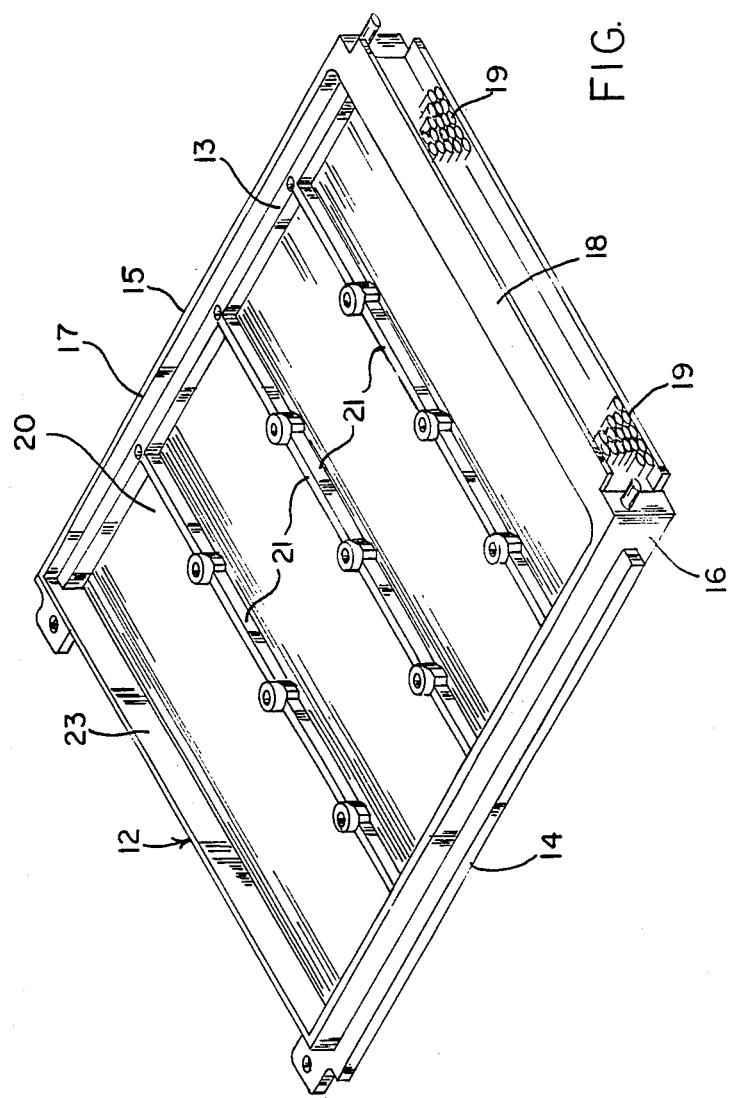

MULTIPLE CIRCUIT BOARD MODULE

BACKGROUND OF THE INVENTION

This invention relates to an improved, multiple circuit board module having increased component density, high vibration resistance and improved thermal conductivity.

Complex electrical circuitry often comprises discrete electronic components mounted upon one or more circuit boards. The circuit boards include circuit paths on one or more layers, which route the signal between the discrete components, and typically include a terminal means to transfer the signals between other circuit boards, or other remote electronic apparatus.

Efforts to standardize electronic packaging and circuit board design have resulted in quality control and format standardization, such as SEM (Standard Electronic Modules) or MIL STD 1389. In the interest of standardization, the SEM specifications have been approved for public release, with unlimited distribution. The SEM specifications are incorporated by reference herein. As circuitry becomes more complex, and component desnity is increased, the thermal energy generated by the discrete components becomes a serious design limitation. When the physical limitations of the discrete components exceeds the package density of a standardized module, a second module is needed; or larger packaging size must be used to meet design requirements. This results in increased cost and increased size requirements, which often become a critical or limiting factor in the circuit design.

U.S. Pat. No. 4,599,680 discloses circuit module packaging for a spacecraft computer utilizing a frame (or base plate) with a circuit board, a metal gasket, and a heat conductive layer mounted above the frame.

U.S. Pat. No. 4,535,385 discloses a circuit module having enhanced heat transfer characteristics for high speed digital computers, wherein two circuit boards are mounted between a cooling plate.

U.S. Pat. No. 4,514,784 discloses an interconnected multiple circuit module wherein two circuit boards are mounted between a cooling plate and interconnected by a connector assembly to similar circuit modules.

U.S. Pat. No. 4,177,499 discloses a circuit board mounted between opposing heat sinks in a housing.

SUMMARY OF THE INVENTION

What is needed is an improved multiple circuit module, which will enable greater component densities, improved vibration resistance, and improved transfer of thermal energy in a SEM (standard electronic module) format.

It is an object of the present invention to disclose a standard electronic module having improved thermal transfer characteristics.

It is also an object of the present invention to disclose a standard electronic module having improved component packaging densities.

It is a further object of this invention to disclose a circuit module having improved vibration resistance.

The above mentioned and other features and objects of this invention and the manner of attaining them will be best understood by reference to the following description of an embodiment of the invention, when considered in conjunction with the accompanying drawings.

BRIEF DESCRIPTION OF THE DRAWINGS

FIG. 6 is a perspective view of the frame.

BEST MODE FOR CARRYING OUT THE INVENTION

The preferred embodiments herein disclosed are not intended to be exhaustive or to limit the invention to the precise forms disclosed. They are chosen and described to enable others skilled in the art to utilize their teachings.

Figure 2:
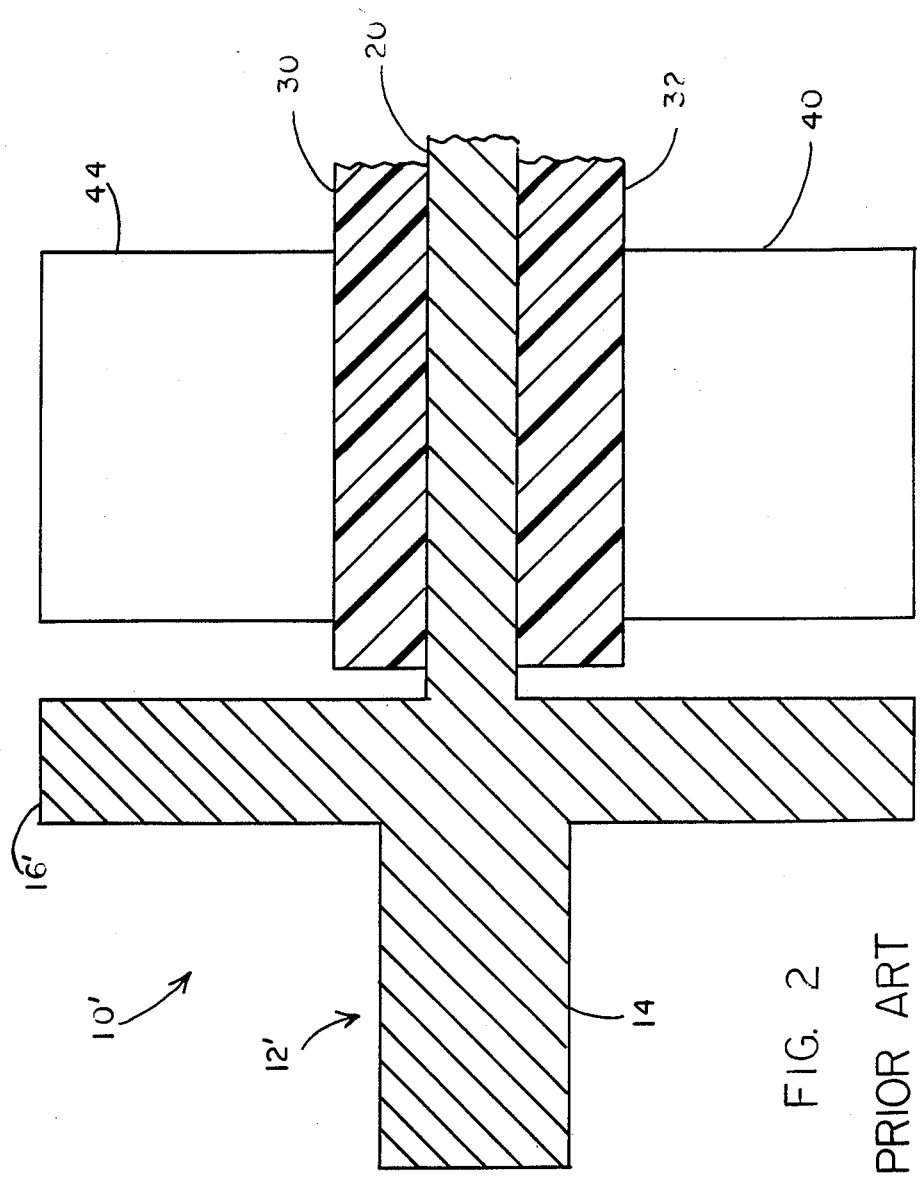
FIG. 2 is an enlarged, fragmentary cross-sectional view of a portion of the frame and two circuit board modules as previously known in the art.

A common circuit module is illustrated in FIG. 2 for illustrative purposes only. Module 10' includes a frame 12' having side walls 16' and a base 20'. A first circuit board 30 and a second circuit board 32 are mounted to the base 20', with discrete components 40, 44 on circuit boards 30, 32 extending away from the base 20'.

When the component density of two circuit boards is exceeded, the conventional design shown in FIG. 2 requires a second module, or larger module format to accomplish the design criteria, while conforming to the specifications of the standardized SEM format. Where enlarged SEM formats, or a second module are not practical, the limitation of two circuit boards per module becomes a limiting design factor.

Figure 1:
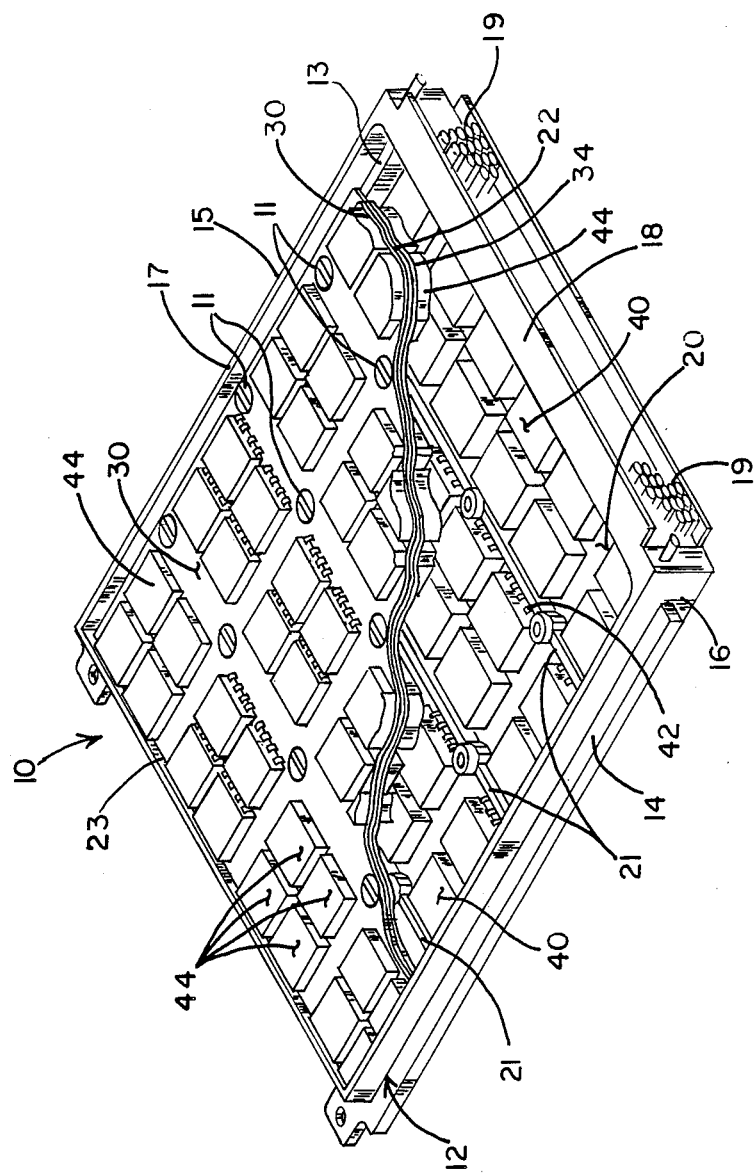
FIG. 1 is a perspective view of a preferred embodiment of a multiple circuit module of the present invention, with a portion of the upper circuit boards cut away to show the base with a plurality of heat generating discrete components mounted thereon.

FIG. 1 illustrates one preferred embodiment of the multiple circuit module 10. Module 10 includes an internal frame 12 which has external mounting flanges 14, 15 extending from opposite side walls 16, 17. Frame 12 also includes end wall 18 which is adapted to secure a plurality of terminal pins 19. Pins 19 electrically connect a multitude of circuit paths on circuit boards 30, 32, 34 mounted within multiple circuit module 10 to an external apparatus (not shown). The frame end wall 23 opposite frame end wall 18 serves to strengthen multiple circuit module 10. Frame side walls 16, 17 each include a recessed inner shoulder part 13. A plurality of ribs 21 extend between side walls 16, 17 to further strengthen multiple circuit module 10. (See FIG. 9). Ribs 21 define a pluurality of holes for accommodating a securement device such as fasteners 11. Frame 12 is preferably made of a non-ferrous material which exhibits excellent thermal conductivity to aid in the transfer of heat generated by discrete components 40, 44 mounted on circuit boards 30, 32, 34. Frame 12 also includes a base plate 20 to further provide strength, vibration resistance, and thermal conductivity.

In order that a degree of consistency may be maintained between the figures, a common numbering scheme will be utilized for electronic components. The numeral 40 will indicate the component is a leaded heat generating component having leads 42. Typically component 40 will bridge apertures formed in a heat sink and its leads will be through or surface mounted to the circuit board. The numeral 44 will indicate the component is a leadless variety component. Component 44 will have lead pads 43 which are surface mounted to the circuit board.

Figure 3:
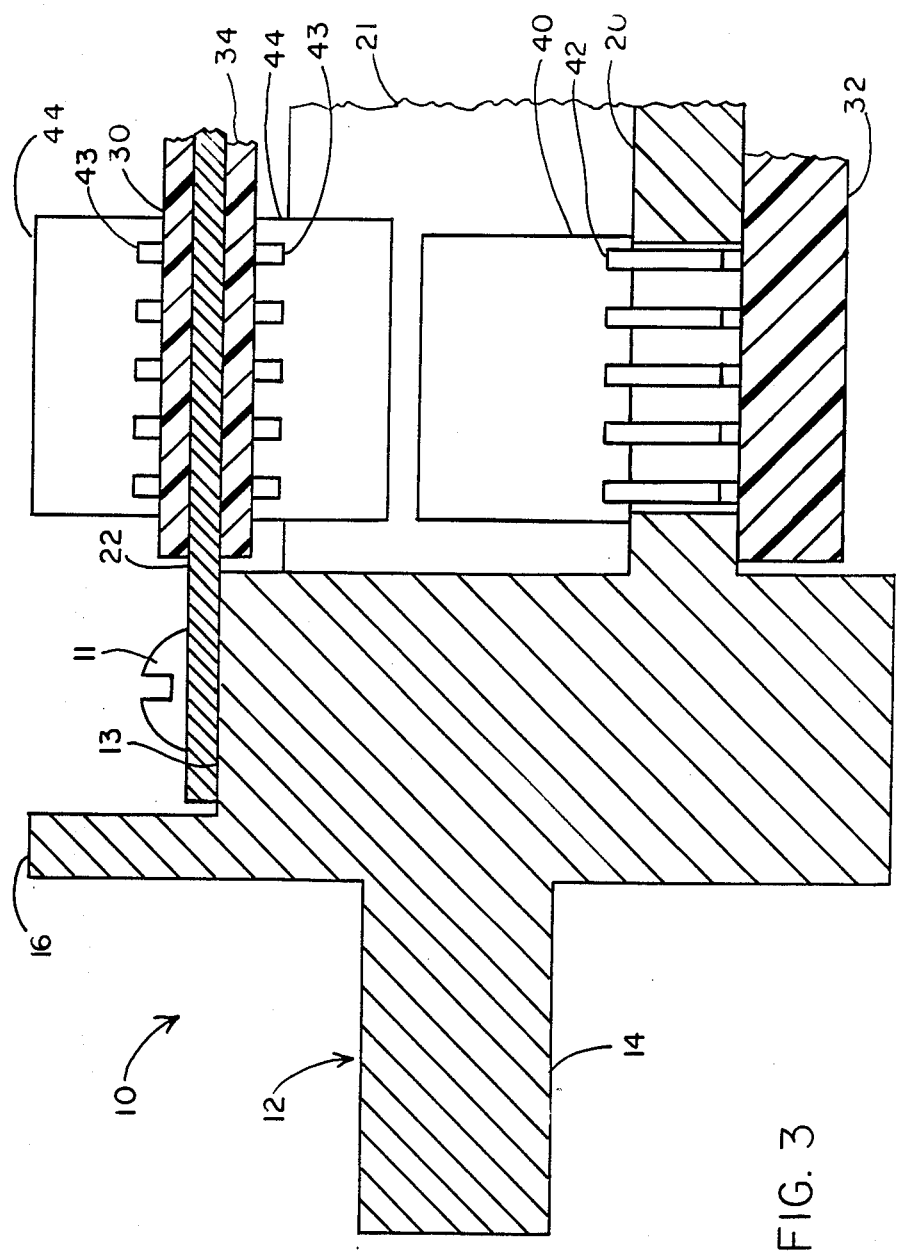
FIG. 3 is an enlarged, fragmentary cross-sectional view of a portion of one embodiment of the present invention as shown in FIG. 1.

FIG. 3 illustrates an enlarged, cross sectional view of a preferred embodiment of this invention, wherein first circuit board 30 and third circuit board 34 are mounted to a first support plate 22. Plate 22 is secured by conventional means such as fasteners 11 to frame shoulder part 13 above the plurality of ribs 21.

As shown in FIG. 3, three circuit boards 30, 32 and 34 are adapted by the present invention to fit within the standardized SEM format formerly occupied by two circuit boards 30, 32 (see FIG. 2). A plurality of apertures 47 are preferably defined in base 20 to allow component leads 42 to extend from discrete components 40 to be surface mounted or through mounted to the second circuit board 32 while maintaining contact between base 20 and the component's body. Components 44 are surface mounted to circuit boards 30, 34.

Component density is increased within the standard SEM format, by spacing the components 40, 44 to allow them to be positioned between the plurality of ribs 21. Vibration resistance is improved by the strategic placement of ribs 21 adjacent to the base 20. Thermal conductivity is improved by the strategic placement of heat generating components 40 adjacent to the thermally conductive base 20. Further, thermally conductive ribs 21 transfer heat from the area between the ribs to the frame side walls 16, 17 where the mounting flanges 14, 15 may be adapted to transfer thermal energy to an external housing (not shown), in a conventional manner.

The increased rigidity provided by positioning base 20 adjacent to ribs 21 serves to improve vibration resistance. By positioning the body of heat generating discrete components 40 directly upon base 20, thermal conductivity is also improved.

The increased circuit density made possible by securing three circuit boards 30, 32, 34 (FIG. 3) in an area formerly occupied by two circuit boards 30, 32 (FIG. 2) provides an important advancement in complex circuit module design.

Figure 4:
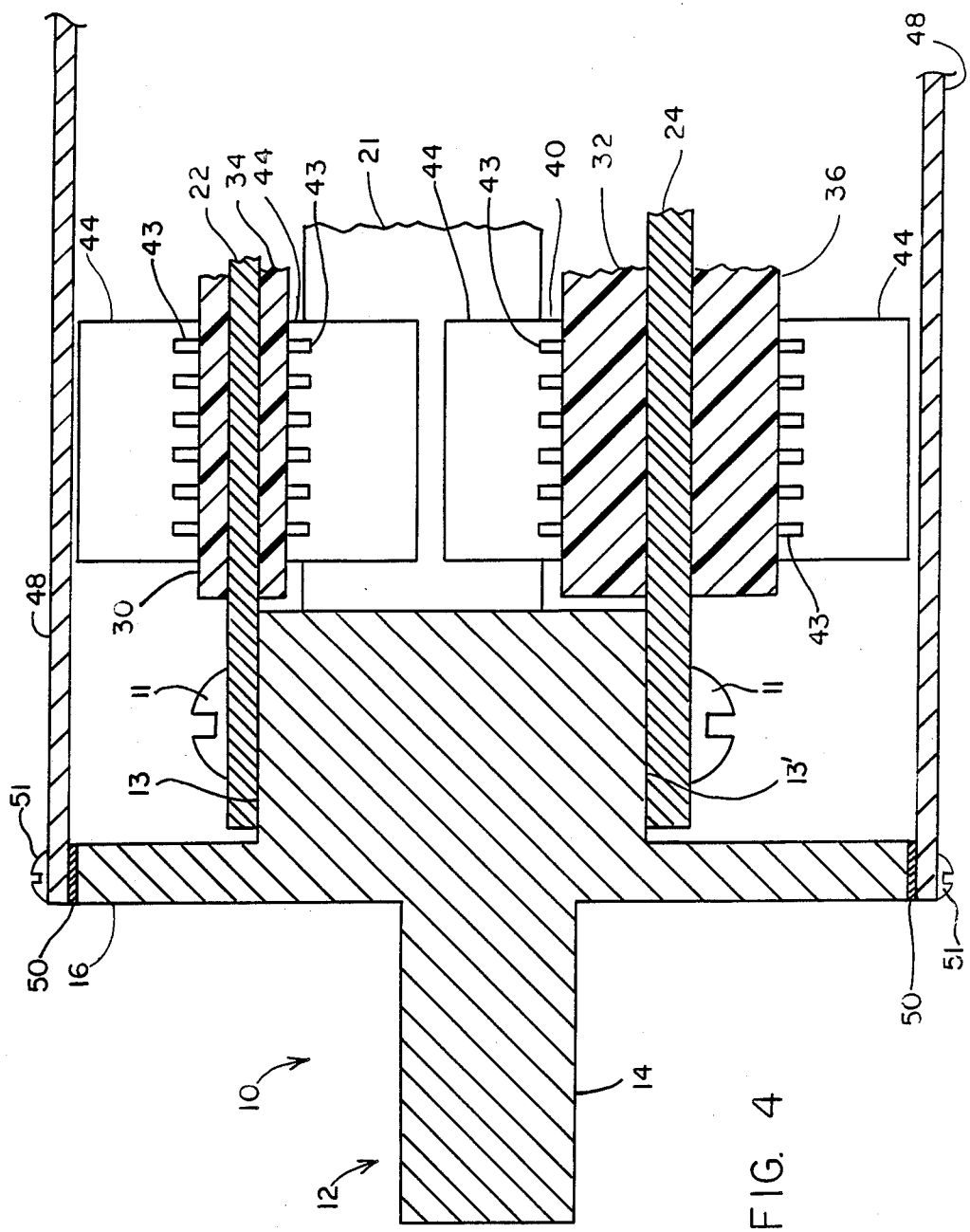
FIG. 4 is an enlarged, fragmentary cross-sectional view of an alternate embodiment of the multiple circuit module shown in FIG. 3.

FIG. 4 is an alternate embodiment of the invention shown in FIG. 3, wherein a second support member 24 is secured to a frame shoulder 13' below ribs 21. The second circuit board 32 is secured to one side of the second support member 24, and a fourth circuit board 36 is secured to the opposite side of second support member 24. This enables four circuit boards 30, 32, 34, 36 to be disposed within a SEM format (FIG. 4) formerly occupied by two circuit boards 30, 32 shown in FIG. 2.

The releasable securement of support members 22, 24 provides easier maintenance and/or ease of replacement of circuit boards or their components within the SEM format. The first and second support members 22, 24 are preferably made of thermally conductive material to aid in the transfer of thermal energy from discrete components 44 to frame 12.

A cover 48 may be adapted to extend between the upper and lower parts side walls 16, 17 and end walls 18, 23 of frame 12 to enclose the multiple circuit module in order to protect the circuitry located therein.

Covers 48 may be hermetically sealed by any conventional manner known in the art to further protect the enclosed circuitry and discrete components located within the SEM design. A gasket 50 shown in FIG. 4 is one such known means to hermetically seal cover 48 to frame 12. For ease of maintenance, the covers 48 are preferably releasably secured to frame 12 by any conventionally known manner such as by fasteners 51.

Figure 5:
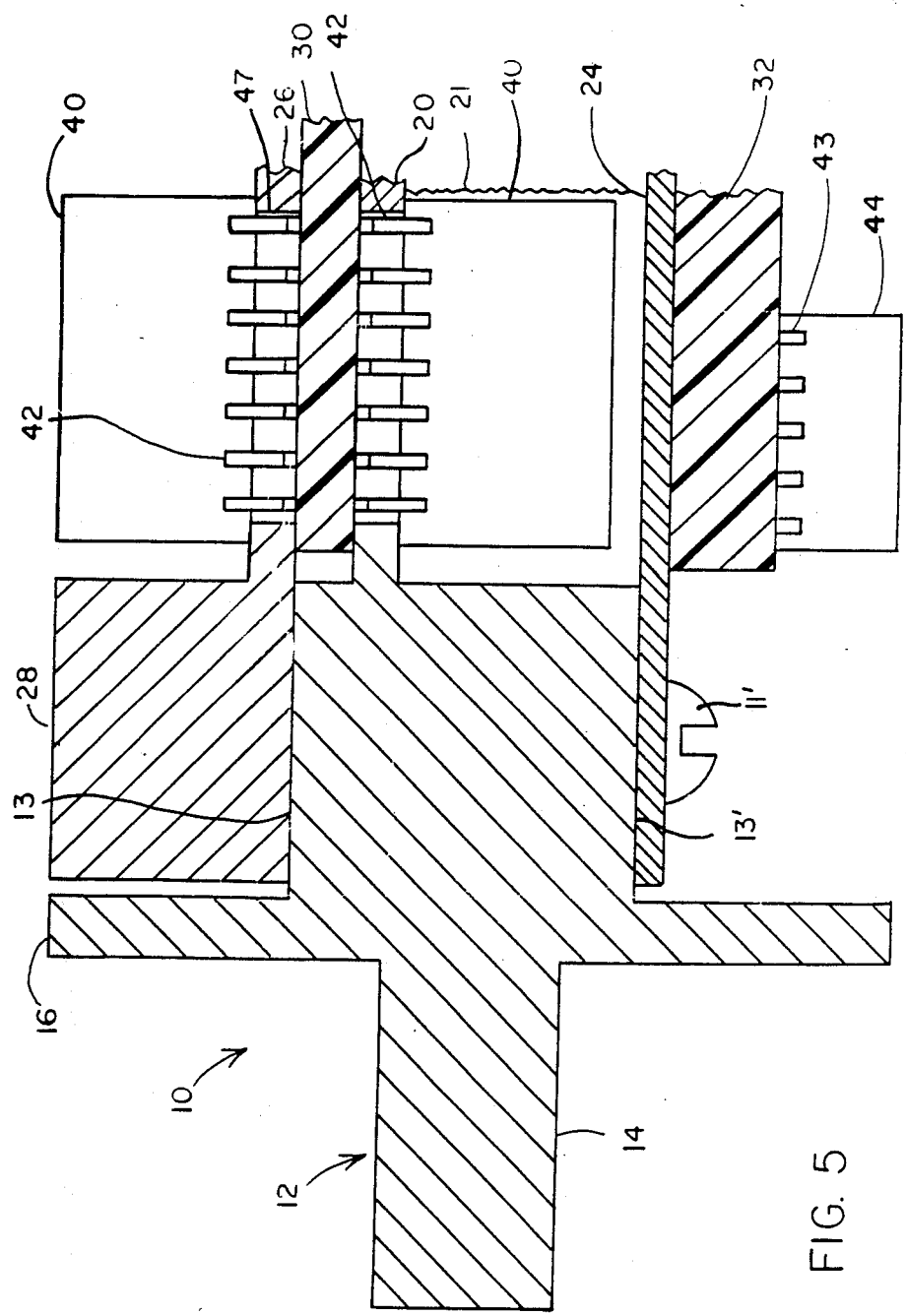
FIG. 5 is an enlarged, fragmentary cross-sectional view of a further embodiment of the present invention.

FIG. 5 is an alternate embodiment of the SEM format shown in FIG. 4, wherein base 20 of frame 12 is disposed above ribs 21, and first circuit board 30 is secured to base 20 above the ribs 21. As previously noted, apertures 46 are disposed through base 20 to allow the component body to contact base 20 while leads 42 from discrete components 40 to extend through apertures 46 for surface mounting to first circuit board 30.

A third support member 26 is disposed adjacent to first circuit board 30 on the side opposite base 20. Preferably, third support member 26 has an enlarged portion 28 disposed in proximity to frame shoulder 13 to improve the transfer of thermal energy generated by discrete components 40 to frame 12. Apertures 47 are disposed in third support 26 to allow leads 42 from components 40 to be surface mounted to circuit board 30.

Heat generated by discrete components 40 is transferred by direct surface contact with support 26 and base 20 to base portion 20, and by conduction throughout frame 12. Member 24 transfers heat by conduction to frame 12 from components 44. This ability to conduct heat generated by densely packed discrete components, provides for increased component density made possible by increasing the number of circuit boards within a SEM module. This increase in surface mounting area still conforms to the SEM package configuration with regard to width, length and height, while providing higher component density through improved improved thermal energy transfer and improved frame rigidity.

FIG. 6 illustrates a preferred embodiment of frame 12, wherein base 20 is disposed adjacent to ribs 21, which preferably extend between opposing sides 16, 17 of frame 12. The frame 12, excluding pins 19, may be constructed as an integral monolithic device for greater vibration resistance and thermal conductivity. Further portions of base 20 may be removed if additional component mounting space is necessary.

Referring once again to FIG. 1, two circuit boards 30, 34 having a dense discrete component mounting configurations are shown in partial cut-away view. Circuit boards 30, 34 are mounted on each side of an upper support plate 22 extending between side walls 16, 17 of frame 12. Components 44 on circuit board 34 are positioned between the ribs 21 and frame side walls 16, 17.

Circuit board 32 is secured beneath base portion 20 (see FIG. 3), with the bodies of discrete components 40 preferably mounted directly upon base 20 for improved thermal energy transfer from components 40 to frame 12. External leads 42 from components 40, preferably extend through apertures 46 in base 20 for securement to circuit board 32.

Thus, by increasing the number of circuit boards within a standardized SEM format, the overall component density is increased, while using standardized discrete components known in the art. The placement of ribs 21 below circuit boards 30, 32 adds rigidity to the SEM design, and thus improves vibration resistance. The placement of discrete components in the space between the ribs 21 and providing the heat sinking surfaces of support plates 20, 22, 24 improves transfer of thermal energy generated by the discrete components to the frame. The placement of the body of heat generating discrete components 40 directly upon base plate 20 further side in transfer of thermal energy from the components, to the frame.

It should be understood that ribs 21 may be omitted if a higher component density is required.

It should be further understood that the invention is not to be limited to the precise forms disclosed but may be modified within the scope of the appended claims.

I claim:

1. An improved standard electronic module (SEM) which comprises:
   (a) a thermally conductive frame including end walls and side walls;
   (b) a plurality of thermally conductive spaced ribs extending between said frame side walls;
   (c) a first circuit board secured by a first securing means to said frame above said ribs between said frame side walls and said frame end walls;
   (d) a second circuit board secured by a second securing means to said frame below said ribs between said frame side walls and said frame end walls;
   (e) a plurality of first discrete electronic components connected to said first circuit board and positioned within spacings of said spaced ribs;
   (f) a plurality of second discrete electronic components connected to said second circuit board and positioned within the spacings of said spaced ribs;
   said plurality of ribs constituting means for providing vibration resistance and for conducting thermal energy generated by said plurality of first and second discrete electronic components to said thermally conductive frame.

2. The module of claim 1 wherein said frame includes a thermally conductive base extending substantially between said side walls and said end walls, said base positioned adjacent to said ribs, said second circuit board secured to said base.

3. The module of claim 2 wherein a plurality of apertures are disposed through said base, said apertures positioned to allow passage of external leads from said plurality of second discrete electronic components mounted upon said base, said external leads extending through said apertures in said base to said second circuit board.

4. The module of claim 1 wherein said first securing means comprises a first support member positioned between said side walls, said circuit board mounted on a first surface of said first support member, and a third circuit board mounted on said first support member on a second surface of said first support member opposite said first surface of said first support member.

5. The module of claim 4 wherein said second securing means comprises a second support member positioned between said side walls, said second circuit board mounted on a first surface of said second support member, and a fourth circuit board mounted on said second support member on a second surface of said second support member opposite said first surface of said second support member.

6. The module of claim wherein a first cover extends in spaced relation above said plurality of first discrete components, said first cover mounted above said first circuit board for releasable securement to said side walls and said end walls, and wherein a second cover extends in spaced relation below said plurality of second discrete components for releasable securement to said side walls and said end walls.

7. The module of claim 6, wherein the first and second covers are each hermetically sealed to said side walls and said end walls.

8. The module of claim 1, wherein said frame is fabricated from thermally conductive material.

9. The module of claim 1, wherein an external mounting flange extends substantially along each side wall of said frame, said mounting flange constituting means for securing said module within a housing and to dissipate heat generated by said discrete components from said frame to the housing.

10. An improved, multiple circuit board module which comprises:
    (a) a thermally conductive frame having a connector mounting end wall, an opposite end wall, opposite side walls and a base extending substantially between the side walls and end walls;
    (b) a plurality of thermally conductive, spaced ribs extending between the frame side walls, said spaced ribs being adjacent to the base;
    (c) a first circuit board with a plurality of discrete components disposed thereon, the first circuit board secured by a securing means to the side walls of the frame;
    (d) a second circuit board disposed adjacent to the base, apertures disposed through the base; and
    (e) a plurality of discrete components disposed upon the base, external leads extending from the discrete components through the aperture to the second circuit board disposed adjacent to the base; wherein the base and ribs constitute means for improving vibration resistance and thermal transfer of heat generated by the discrete electronic components to the thermally conductive frame.

11. The module of claim 10, wherein a first cover extends in spaced relation above the discrete components mounted upon the first circuit board for releasable securement to the side walls and end walls of the frame, and a second cover extends in spaced relation below the second circuit board for releasable securement to the side walls and end walls of the frame.

12. The module of claim 11, wherein the first and second covers are each hermetically sealed to the side walls and end walls of the frame.

13. The module of claim 10, wherein said securing means comprises a first support member extending between the side walls of the frame adjacent to the first circuit board, and wherein a third circuit board is disposed adjacent to the first support member on a side of the first support member opposite the first circuit board.

14. The module of claim 10, wherein the frame is fabricated from thermally conductive.

15. The module of claim 10, wherein an external mounting flange extends substantially along each side wall of the frame to aid in securement of the module within a housing, and to dissipate heat generated by the discrete components from th frame to the housing.

* * * * *